US007309515B2

United States Patent
Tsai et al.

(10) Patent No.: US 7,309,515 B2
(45) Date of Patent: Dec. 18, 2007

(54) METHOD FOR FABRICATING AN IMPRINT MOLD STRUCTURE

(75) Inventors: Hung-Yin Tsai, Taipei (TW);
Chih-Hung Wu, Taipei (TW);
Chih-Yung Cheng, TaiTung (TW)

(73) Assignee: Industrial Technology Research Institute, Hsinchu (TW)

( * ) Notice: Subject to any disclaimer, the term of this patent is extended or adjusted under 35 U.S.C. 154(b) by 369 days.

(21) Appl. No.: 10/770,526

(22) Filed: Feb. 4, 2004

(65) Prior Publication Data

US 2005/0170292 A1    Aug. 4, 2005

(51) Int. Cl.
*B05D 3/00* (2006.01)
(52) U.S. Cl. .................. 427/271; 427/272; 427/282; 427/249.7; 427/249.8; 427/534; 216/37; 216/66; 438/707; 438/759
(58) Field of Classification Search ............. 427/249.1, 427/249.8, 534, 96.1, 99.2, 99.3, 98.4, 271, 427/272, 282, 249.7; 438/707, 759, 795, 438/948, 949; 216/37, 66
See application file for complete search history.

(56) References Cited

U.S. PATENT DOCUMENTS

| | | | | |
|---|---|---|---|---|
| 5,843,224 A | * | 12/1998 | Zachai et al. | 117/94 |
| 6,056,887 A | * | 5/2000 | Niedermann et al. | 216/2 |
| 6,350,389 B1 | * | 2/2002 | Fujishima et al. | 216/56 |
| 6,671,034 B1 | * | 12/2003 | Hatakeyama et al. | 355/67 |
| 6,767,771 B2 | * | 7/2004 | Kim | 438/142 |
| 7,067,207 B2 | * | 6/2006 | Kamata et al. | 428/836 |
| 2004/0211755 A1 | * | 10/2004 | Yusa et al. | 216/54 |
| 2004/0214447 A1 | * | 10/2004 | Stasiak et al. | 438/710 |
| 2005/0084804 A1 | * | 4/2005 | Truskett et al. | 430/311 |
| 2005/0126470 A1 | * | 6/2005 | Herman et al. | 117/2 |
| 2005/0146793 A1 | * | 7/2005 | Nellissen | 359/619 |
| 2005/0271819 A1 | * | 12/2005 | Wago et al. | 427/259 |

* cited by examiner

*Primary Examiner*—Bret Chen
(74) *Attorney, Agent, or Firm*—Troxell Law Office, PLLC

(57) ABSTRACT

The present invention is related to a method for fabricating an imprint mold which can be used in the field of nano-imprint lithography. Firstly, a diamond film and a photoresist film are successively formed onto a substrate; wherein the photoresist film is more capable of anticorrosion than the diamond film. Then an energy beam lithography system is provided to make the photoresist film form a photoresist mask with particularly arranged patterns. Because of the etching selectivity between the diamond film and the photoresist film, on the surface of the diamond film a pattern can be easily formed with recessions and protrusions according to the photoresist mask by dry etching method.

5 Claims, 5 Drawing Sheets

| | Knoop Hardness (GPa) | Compressive Strength (GPa) | Tensile Strength (GPa) | Thermal Conductivity (W·cm$^{-1}$ °C) | Thermal Expansion Coefficient ($10^{-6}$ °C) |
|---|---|---|---|---|---|
| Diamond | 68.8 | 8.52 | 3.92 | 20 | 1.0 |
| Sapphire | 20.6 | 2.84 | 2.16 | 0.5 | 5.5 |
| Quartz | 8.04 | 1.13 | 0.049 | 0.014 | 0.55 |
| Silicon | 11.5 | 0.12 | 0.113 | 1.56 | 2.56 |

FIG. 2

| Etching Rate (μm/hr) | | |
|---|---|---|
| photoresist | Diamond | O₂plasma |
| 11.4 (KRS-XE) | 6.0 (1) | |
| 9 (10wt% $SiO_2$ KRS-XE) | | |
| 6 (15wt% $SiO_2$ KRS-XE) | | |
| 1.74 (25wt% $SiO_2$ KRS-XE) | | |

FIG. 4

METHOD FOR FABRICATING AN IMPRINT MOLD STRUCTURE

FIELD OF THE INVENTION

The present invention relates to a structure of imprint mold and the method for fabricating the same, in particular to a nano-imprint mold made of diamond material and the fabricating method thereof in order to extend the mold lifetime and reduce the manufacture cost when applying the nano-imprint process technology.

BACKGROUND OF THE INVENTION

Along with the semiconductor manufacturing process entering the era of nanotechnology, the traditional photolithography is confronted with the predicament, the physical extremity of the optical wavelength. Therefore, finding a substitution technology with low cost and high production thus becomes the key point in the next generation researches. Wherein, the nano-imprint lithography possessing the characters of thin line width, low cost, and high production is considered as the main stream of the next generation lithography technology. Meanwhile, the related patents are quickly accumulated.

The beginning of Nano-Imprint Lithography (NIL) applied in semiconductor manufacturing starts at 1996 when Dr. Stephen Chou published the noted paper, Imprint lithography with 25-nanometer resolution, Science 272, 85 (1996), of which the principle is like to stamp a template into the soft plastic. Please refer to FIG. 1A to 1C, which are the schematic views showing the standard semiconductor manufacturing process with Nano-Imprint Lithography. Firstly, a mold 11 having a particularly arranged pattern with protruding and recessing portions on its surface is formed by the lithography technology (such as mask, e-beam, focused ion beam, and so on). Then, a resist material 12, such as Polymethyl methacrylate (PMMA), is formed on the substrate 13. With appropriate temperature and pressure, the mold 11 is pressed onto the resist material 12 with the patterned surface thereof thus transferring the pattern of the mold surface to the resist material 12. Instead of the traditional photolithography method, the mold of such technology is processed with an energy beam system, which can easily improve the resolution attaining to the nano-level. Further, the nano-imprint lithography can reduce the process steps so as to uplift the throughput. In addition, the mold can be reused for many times and has longer lifetime than the traditional mask thus can large reduce the production cost.

However, the process of the mold belongs to the ultra precision technology that consumes lots amount of process time and production cost. Besides, in the imprinting process, the contact or even the collision between the mold and the substrate will cause certain attrition. Therefore, if the capability of antifriction of the mold is so worse as to need large quantity of alternate molds for replacing the damaged one, the application of nano-imprint lithography will suffer certain limitation. In addition, if the surface reaction force between the mold surface and the resist material is too large, when the mold is took off from the resist material, it will cause the mold to absorb certain residue thus resulting in not only the deviation of the device size but also the extra spending of the time and the cost for clean the mold surface. So, how to manufacture a mold with the characters of better antifriction and easily taking off from imprinted materials thus becomes a key point in the related researches.

In the IEEE Microprocesses and Nanotechnology Conference, 2001, the team of Japan Osaka Prefecture University disclosed a method to coating quartz and nickel onto the silicon mold surface. Moreover, Dr. Y. Tokano of TOKYO University of Science also published another technology using sapphire as the mold material to solve the aforesaid problems. Please refer to FIG. 2, which is the table comparing several physic characters of quartz, sapphire, silicon, and diamond. Obviously, in all the aspects of hardness, tension, heat conductivity, and thermal expansion coefficient, diamond is better than any other ones. Therefore, the present invention employs the diamond material as the principle part of the mold thus obtaining the objects of high antifriction and easily taking off from imprinted materials. Besides, corresponding to the appropriate process, the present invention can also provides the effects of cost reduction and mass production.

SUMMARY OF THE INVENTION

The primary object of the present invention is to provide a structure of an imprint mold and a method for fabricating the same, which uses the diamond material as the major part of the mold thus obtaining the effects of better antifriction and easily taking off from imprinted materials.

The secondary object of the present invention is to provide a structure of an imprint mold and a method for fabricating the same, which applies the character of etching selectivity between the photoresist material and the diamond material to carry out the etching process directly on the diamond film surface thus obtaining the effects of process step reduction and cost reduction.

In order to achieve the aforesaid objects, the present invention provides a structure of an imprint mold including a substrate and a diamond film. Wherein, the diamond film is formed on the substrate, and its surface has a particularly arranged pattern with protrusions and recessions.

In order to achieve the aforesaid objects, the present invention provides a method for fabricating the imprint mold including the following steps:
a) Proving a substrate.
b) Forming a diamond film onto the substrate.
c) Forming a photoresist film onto the diamond film.
d) Using an energy beam lithography system to make the photoresist film form a particularly arranged pattern with recessions and protrusions, wherein the bottom of the recessions exposing the diamond film;
e) Using a method of reactive ion etching to remove the exposed diamond film; and
f) Removing the photoresist film thus transferring the particularly arranged pattern onto the surface of the diamond film so as to complete the imprint mold.

BRIEF DESCRIPTION OF THE DRAWINGS

FIG. 2 is the table comparing several physic characters of quartz, sapphire, silicon, and diamond

FIG. 4 is the table comparing the etching rates between diamond material and the photoresist KRS-XE doped with different amount of silicon dioxide.

DETAILED DESCRIPTION OF THE INVENTION

Matched with corresponding drawings, the preferable embodiments of the invention are presented as following and hope they will benefit your esteemed reviewing committee members in reviewing this patent application favorably.

Figure 1A:
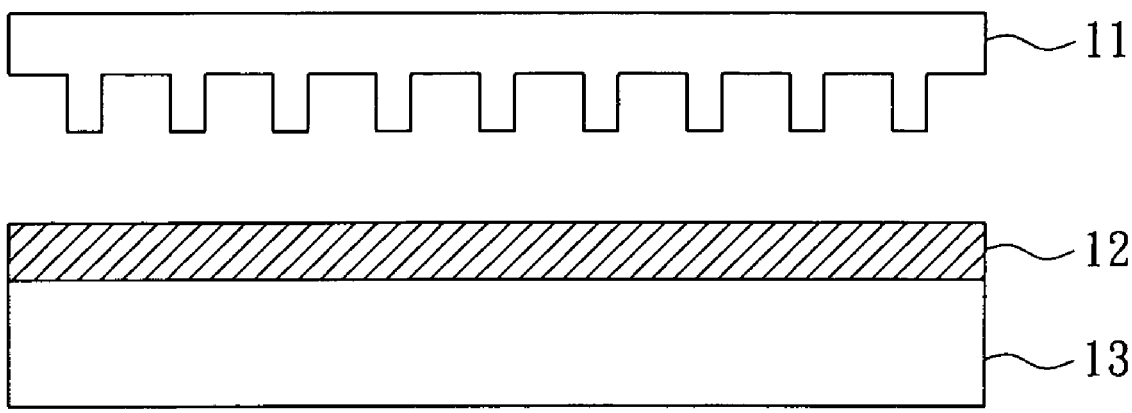
FIG. 1A to FIG. 1C are the schematic views showing the technology of nano-imprint lithography employed in the semiconductor manufacturing process.
Figure 1B:
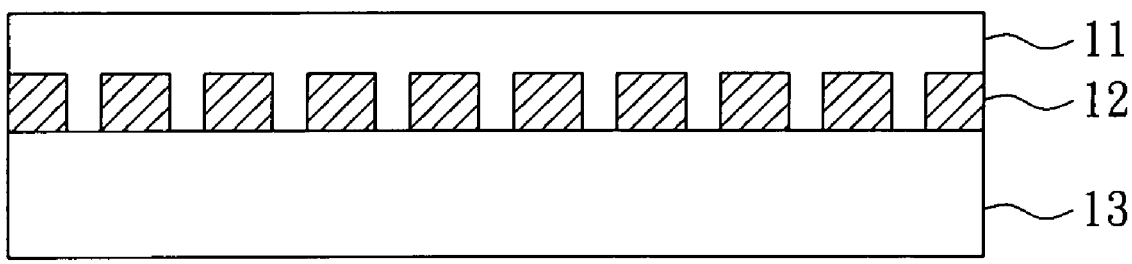
Figure 1C:
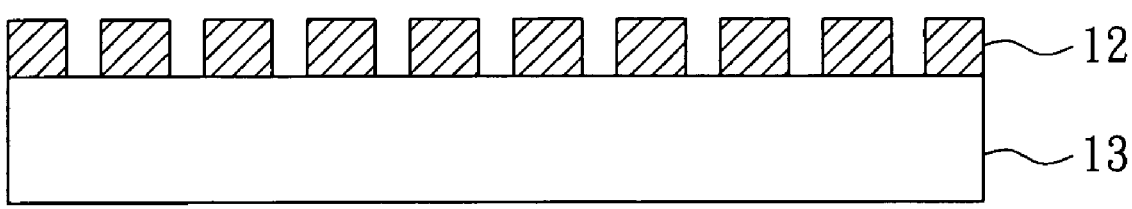
Figure 3A:
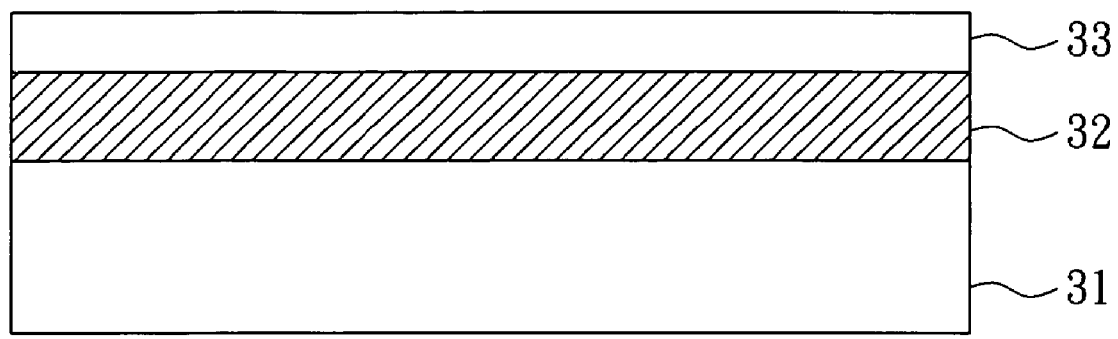
FIG. 3A to FIG. 3D are the schematic views showing the best embodiment of the method for fabricating the imprint mold of the present invention.
Figure 3B:
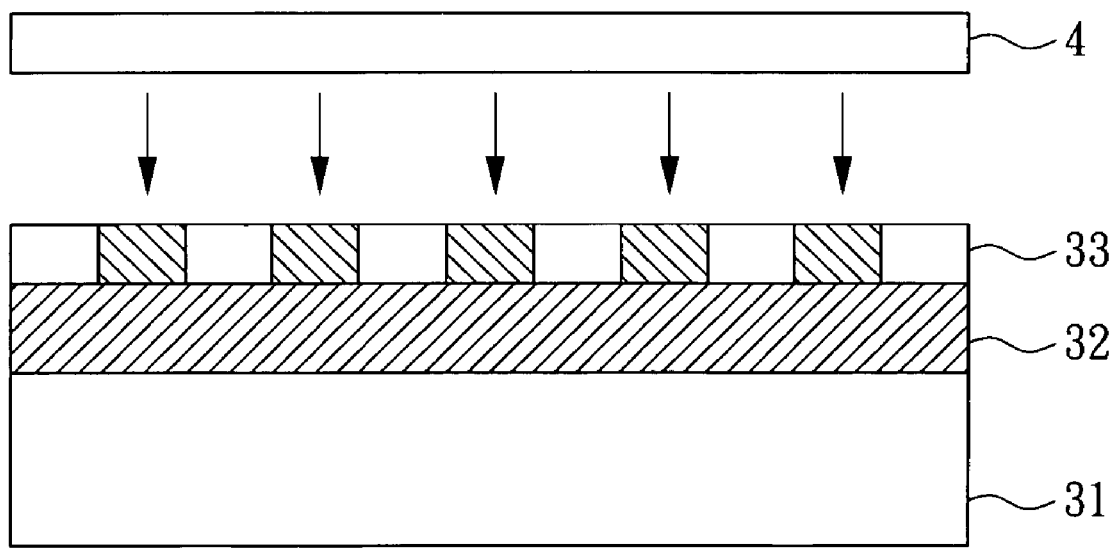
Figure 3C:
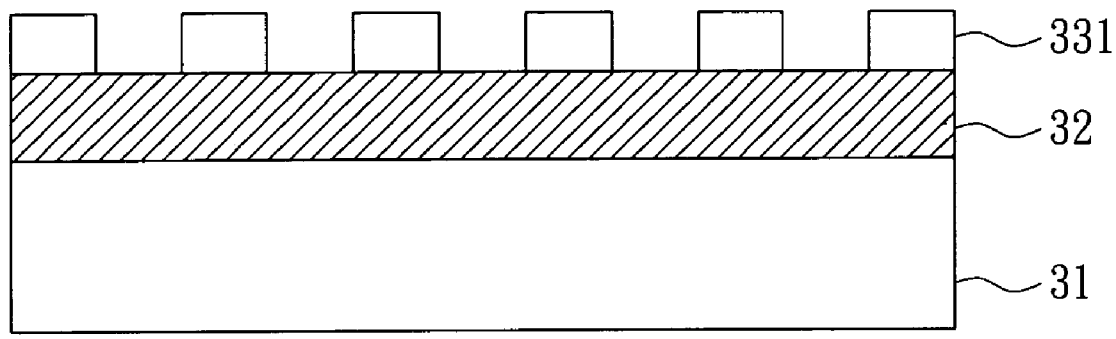
Figure 3D:
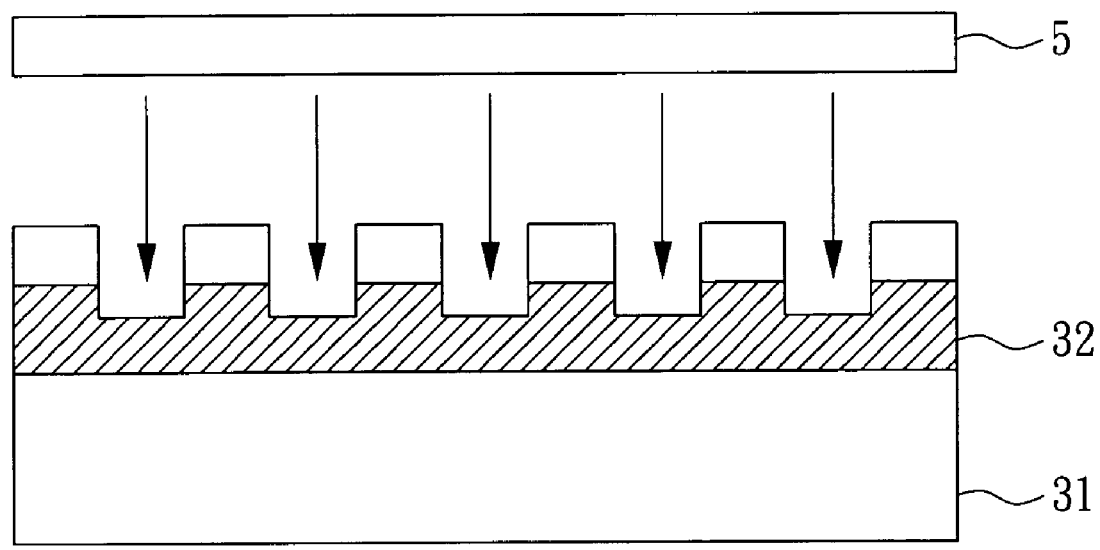

Please refer to FIG. 3A to FIG. 3D, which are the schematic views showing the best embodiment of the method for fabricating the imprint mold of the present invention. Firstly, a substrate 31 is provided; wherein, the material of the substrate 31 can be various, such as silicon wafer, quartz, sapphire, tungsten, molybdenum, titanium, iridium, magnesia and so on according to the different applications of the nano-imprint process. Then a diamond film 32 is formed on the substrate 31; wherein the material of the diamond film 32 can be diamond or diamond like carbon (DLC), and the forming method thereof can be the chemical vapor deposition (CVD). The thickness of the diamond film 32 needs not be too thick, just only thicker than what the imprint process needs. Therefore, the fabricating process of the diamond film 32 can be controlled in a short time, and further reduce the production cost.

Next, on the diamond film 32 is formed a photoresist film 33, which can be used as the mask for forming the surface pattern of the mold. In the preferable embodiment, the material of the photoresist film 33 can be the photoresist KRS-XE doped with appropriate amount of silicon dioxide. FIG. 4 is the table comparing the etching rates between diamond material and the photoresist KRS-XE doped with different amount of silicon dioxide, extracted from Microelectronic Engineering 63 (2002) 391-403. Obviously, when the percentage of the photoresist KRS-XE mixed with silicon dioxide is larger than 15%, the etching rate of the diamond material will become relative low, which is a very important character that can be applied in the present invention.

Then, an energy beam lithography system 4 is provided to carry out the step of development on the photoresist film 33. The using energy beam can be the electron beam, laser beam, focus ion beam (FIB) and so on. By such precise energy beam system, the size of the mold pattern can easily attain to the nano-level thus making the present invention more practicable. After the step of development, the photoresist film 33 will generate a particular pattern, forming the photoresist mask 331. Next, the method of dry etching 5, such as reactive ion etching (RIE), is used for the patterning process on the diamond film 32. Because of the certainly different etching selectivity between the diamond material and the photoresist material, the areas of the diamond film 32 exposed to the exterior will be etched much faster than those covered with the photoresist mask 331 thus forming a plurality of recessions 321 with appropriate depth according to the pattern of the photoresist mask 331. Finally, after the photoresist mask 331 removed, the diamond mold with a particularly arranged pattern surface 322 will be completed.

The mold of the present invention not only can be used in the field of nano-imprint lithography, but also all the similar imprinting process. Instead of the traditional method that uses e-beam lithography technology to process mold surface directly, the present invention integrates the energy beam lithography technology and the dry etching method so as to largely reduce the process step. Moreover, the energy beam lithography technology practices the object of precise location attained to nano-level, and the dry etching method can quickly form the required recessions of the mold thus saving certain process time and production cost and making the present invention more practicable.

In summary, from the structural characteristics and detailed disclosure of each embodiment according to the invention, it sufficiently shows that the invention has progressiveness of deep implementation in both objective and function, also has the application value in industry, and it is an application never seen ever in current market and, according to the spirit of patent law, the invention is completely fulfilled the essential requirement of new typed patent.

What is claimed is:

1. A method for fabricating an imprint mold includes:
   a) providing a substrate;
   b) forming a diamond film onto the substrate;
   c) forming a photoresist film onto the diamond film;
   d) using an energy beam lithography system to make the photoresist film form a particularly arranged pattern with recessions and protrusions, wherein the bottom of the recessions formed by the energy beam lithography system expose the diamond film;
   e) using a method of reactive ion etching to remove the exposed diamond film; and
   f) removing the photoresist film thus transferring the particularly arranged pattern onto a surface of the diamond film so as to complete the imprint mold, wherein the material of the substrate is selected from the group consisting of silicon wafer, quartz, sapphire, tungsten, molybdenum, titanium, iridium, and magnesia, wherein the material of the photoresist film is photoresist mixed with 15~50% silicon dioxide.

2. The method for fabricating an imprint mold recited in claim 1, wherein the material of the diamond film is selected from the group consisting of diamond and diamond like carbon (DLC).

3. The method for fabricating an imprint mold recited in claim 1, wherein the forming method of the diamond film in step (b) is chemical vapor deposition (CVD).

4. The method for fabricating an imprint mold recited in claim 1, wherein the energy beam used by the energy beam lithography system is selected from the group consisting of electron beam, laser beam, and focus ion beam (FIB).

5. The method for fabricating an imprint mold recited in claim 1, wherein the imprint mold can be used in the field of Nano-Imprint Lithography.

* * * * *